(12) United States Patent
Feng

(10) Patent No.: US 11,917,778 B2
(45) Date of Patent: Feb. 27, 2024

(54) FOLDABLE DISPLAY DEVICE

(71) Applicant: Wuhan China Star Optoelectronics Semiconductor Display Technology Co., Ltd., Hubei (CN)

(72) Inventor: Zikang Feng, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 881 days.

(21) Appl. No.: 16/966,023

(22) PCT Filed: Jun. 16, 2020

(86) PCT No.: PCT/CN2020/096350
§ 371 (c)(1),
(2) Date: Jul. 30, 2020

(87) PCT Pub. No.: WO2021/237822
PCT Pub. Date: Dec. 2, 2021

(65) Prior Publication Data
US 2023/0180408 A1    Jun. 8, 2023

(30) Foreign Application Priority Data
May 28, 2020 (CN) .......................... 202010467288.9

(51) Int. Cl.
*H05K 5/00* (2006.01)
*F16C 11/04* (2006.01)
(Continued)

(52) U.S. Cl.
CPC ............ *H05K 5/0226* (2013.01); *F16C 11/04* (2013.01); *H10K 77/111* (2023.02); *H10K 2102/311* (2023.02)

(58) Field of Classification Search
CPC ... H05K 5/0017; H05K 5/0217; H05K 5/0226
(Continued)

(56) References Cited

U.S. PATENT DOCUMENTS 9,173,288 B1 * 10/2015 Kim ....................... G06F 1/1681
2018/0279489 A1 * 9/2018 Ochi ........................ E05D 7/00
2019/0350096 A1 * 11/2019 Chao .................... H05K 5/0217

FOREIGN PATENT DOCUMENTS

| CN | 209164358 | 7/2019 |
| CN | 110442196 | 11/2019 |

(Continued)

OTHER PUBLICATIONS

International Search Report and the Written Opinion dated Feb. 24, 2021 From the International Searching Authority Re. Application No. PCT/CN2020/096350 and Its Translation Into English. (13 Pages).

*Primary Examiner* — Hung S. Bui

(57) ABSTRACT

A foldable display device includes a first casing and a second casing. The first casing is rotatable about a first rotation center, and the second casing is rotatable about a second rotation center. Coordinates of an orthographic projection of the first rotation center on an xoy coordinate plane are (x1, y1), and coordinates of an orthographic projection of the second rotation center on the xoy coordinate plane are (-x1, y1). A predetermined value is defined by a sum of coordinate values x1 and y1, the coordinate value x1 is greater than zero, and the coordinate value y1 is greater than -0.3 millimeter (mm) and less than or equal to one mm.

18 Claims, 10 Drawing Sheets

(51) Int. Cl.
*H05K 5/02* (2006.01)
*H10K 77/10* (2023.01)
*H10K 102/00* (2023.01)

(58) Field of Classification Search
USPC .......................................................... 361/807
See application file for complete search history.

(56) References Cited

FOREIGN PATENT DOCUMENTS

| CN | 110473468 | 11/2019 |
| CN | 110718155 | 1/2020 |
| CN | 210041901 | 2/2020 |
| CN | 111049954 | 4/2020 |
| WO | WO 2017/051788 | 3/2017 |

* cited by examiner

FOLDABLE DISPLAY DEVICE

RELATED APPLICATIONS

This application is a National Phase of PCT Patent Application No. PCT/CN2020/096350 having International filing date of Jun. 16, 2020, which claims the benefit of priority of Chinese Patent Application No. 202010467288.9 filed on May 28, 2020. The contents of the above applications are all incorporated by reference as if fully set forth herein in their entirety.

FIELD AND BACKGROUND OF THE INVENTION

The present invention relates to a technical field of foldable displays, and particularly to, a foldable display device.

Currently, foldable display devices have become a major development trend in display industries. However, screens of the foldable display devices are subjected to stress during bending processes, which may cause the screens to have a risk of failure during the bending processes.

Therefore, it is imperative to provide a technical solution to reduce a problem of screen failure of foldable display devices arising from stress during bending processes.

SUMMARY OF THE INVENTION

An object of the present invention is to provide a foldable display device to reduce a problem of screen failure of foldable display devices arising from stress during bending processes.

To achieve the above-mentioned object, the present application provides a foldable display device, comprising a first casing, a second casing, and a flexible display panel, wherein the first casing and the second casing are configured to support the flexible display panel, the first casing and the second casing are disposed opposite to each other, the first casing is rotatable about a first rotation center, and the second casing is rotatable about a second rotation center; wherein a y coordinate axis is defined by a straight line perpendicular to a plan on which the first casing and the second casing are located and extending to a middle between the first casing and the second casing when the foldable display device is in a flat state; and an x coordinate axis is defined by a straight line located on and overlapping a plane the same as that of surfaces of the first casing and the second casing adjacent to the flexible display panel when the foldable display device is in the flat state; wherein the x coordinate axis and the y coordinate axis are coplanar and perpendicular to each other, a coordinate origin o is defined by an intersection of the x coordinate axis and the y coordinate axis, and an xoy coordinate plane is cooperatively defined by the x coordinate axis, the y coordinate axis, and the coordinate origin, wherein coordinates of an orthographic projection of the first rotation center on the xoy coordinate plane are (x1, y1), and coordinates of an orthographic projection of the second rotation center on the xoy coordinate plane are (−x1, y1); wherein a predetermined value is defined by a sum of coordinate values x1 and y1, the coordinate value x1 is greater than zero, the coordinate value y1 is greater than −0.3 millimeter (mm) and less than or equal to 1 mm, and the predetermined value is greater than zero mm and less than or equal to 2.5 mm.

In the foldable display device, the coordinate value y1 is greater than or equal to −0.1 mm.

In the foldable display device, the coordinate value y1 is less than or equal to 0.5 mm.

In the foldable display device, the coordinate value y1 is greater than or equal to −0.1 mm and less than or equal to 0.3 mm.

In the foldable display device, the coordinate value x1 is 1.9 mm and the coordinate value y1 is 0.1 mm.

In the foldable display device, the flexible display panel comprises an organic light-emitting diode (OLED) array layer, and the OLED array layer is spaced apart from the surfaces of the first casing and the second casing adjacent to the flexible display panel at a distance greater than or equal to 0.1 mm and less than or equal to 0.3 mm when the foldable display device is in the flat state.

In the foldable display device, the first rotation center and the second rotation center are located at a side of a lower surface of the OLED array layer adjacent to the first casing and the second casing in a direction of the y coordinate axis when the foldable display device is in the flat state, and each of the first rotation center and the second rotation center is spaced at a distance greater than or equal to 0 mm and less than or equal to 0.243 mm from the lower surface of the OLED array layer, or the first rotation center and the second rotation center are located at a side of the lower surface of the OLED array layer away from the first casing and the second casing, wherein each of the first rotation center and the second rotation center is spaced at a distance greater than 0 mm and less than or equal to 0.157 mm from the lower surface of the OLED array layer, wherein the lower surface of the OLED array layer is a surface of the OLED array layer adjacent to the first casing and second casing.

In the foldable display device, the first casing is rotatable about the first rotation center with a radius between 1 mm and 10 mm, and the second casing is rotatable about the second rotation center with a radius between 1 mm and 10 mm.

In the foldable display device, the first casing and the second casing are configured to rotate simultaneously and symmetrically, and the foldable display device further comprises a dual-axes rotation mechanism; wherein the dual-axes rotation mechanism comprises a first motion arm having the first rotation center, a second motion arm having the second rotation center, a first fixed chute block comprising a first arc-shaped groove, and a second fixed chute block comprising a second arc-shaped groove; wherein the first motion arm comprises a first connection element and a first arc-shaped element connected to one end of the first connection element, an end of the first connection element of the first motion arm away from the first arc-shaped element is fixed in the first casing, the first arc-shaped element of the first motion arm is engaged in the first arc-shaped groove of the first fixed chute block, and the first arc-shaped element matches the first arc-shaped groove; and the second motion arm comprises a second connection element and a second arc-shaped element connected to one end of the second connection element, an end of the second connection element of the second motion arm away from the second arc-shaped element is fixed in the second casing, the second arc-shaped element of the second motion arm is engaged in the second arc-shaped groove of the second fixed chute block, and the second arc-shaped element matches the second arc-shaped groove.

A foldable display device, comprising a first casing, a second casing, and a flexible display panel, wherein the first casing and the second casing are configured to support the flexible display panel, the first casing and the second casing are disposed opposite to each other, the first casing is rotatable about a first rotation center, and the second casing is rotatable about a second rotation center; wherein a y coordinate axis is defined by a straight line perpendicular to a plan on which the first casing and the second casing are located and extending to a middle between the first casing and the second casing when the foldable display device is in a flat state; and an x coordinate axis is defined by a straight line located on and overlapping a plane the same as that of surfaces of the first casing and the second casing adjacent to the flexible display panel when the foldable display device is in the flat state; wherein the x coordinate axis and the y coordinate axis are coplanar and perpendicular to each other, a coordinate origin o is defined by an intersection of the x coordinate axis and the y coordinate axis, and an xoy coordinate plane is cooperatively defined by the x coordinate axis, the y coordinate axis, and the coordinate origin, wherein coordinates of an orthographic projection of the first rotation center on the xoy coordinate plane are (x1, y1), and coordinates of an orthographic projection of the second rotation center on the xoy coordinate plane are (−x1, y1); wherein a predetermined value is defined by a sum of coordinate values x1 and y1, the coordinate value x1 is greater than zero, the coordinate value y1 is greater than −0.3 millimeter (mm) or equal to 1 mm, and the predetermined value is greater than zero.

In the foldable display device, the coordinate value y1 is greater than or equal to −0.1 mm.

In the foldable display device, the coordinate value y1 is less than or equal to 0.5 mm.

In the foldable display device, the coordinate value y1 is greater than or equal to −0.1 mm and less than or equal to 0.3 mm.

In the foldable display device, the predetermined value is between 0.5 mm and −3 mm.

In the foldable display device, the coordinate value x1 is 1.9 mm and the coordinate value y1 is 0.1 mm.

In the foldable display device, the flexible display panel comprises an organic light-emitting diode (OLED) array layer, and the OLED array layer is spaced apart from the surfaces of the first casing and the second casing adjacent to the flexible display panel at a distance greater than or equal to 0.1 mm and less than or equal to 0.3 mm when the foldable display device is in the flat state.

In the foldable display device, the first rotation center and the second rotation center are located at a side of a lower surface of the OLED array layer adjacent to the first casing and the second casing in a direction of the y coordinate axis when the foldable display device is in the flat state, and each of the first rotation center and the second rotation center is spaced at a distance greater than or equal to 0 mm and less than or equal to 0.243 mm from the lower surface of the OLED array layer, or the first rotation center and the second rotation center are located at a side of the lower surface of the OLED array layer away from the first casing and the second casing, wherein each of the first rotation center and the second rotation center is spaced at a distance greater than 0 mm and less than or equal to 0.157 mm from the lower surface of the OLED array layer, wherein the lower surface of the OLED array layer is a surface of the OLED array layer adjacent to the first casing and second casing.

In the foldable display device, the first casing is rotatable about the first rotation center with a radius between 1 mm and 10 mm, and the second casing is rotatable about the second rotation center with a radius between 1 mm and 10 mm.

In the foldable display device, the first casing and the second casing are configured to rotate simultaneously and symmetrically, and the foldable display device further comprises a dual-axes rotation mechanism; wherein the dual-axes rotation mechanism comprises a first motion arm having the first rotation center, a second motion arm having the second rotation center, a first fixed chute block comprising a first arc-shaped groove, and a second fixed chute block comprising a second arc-shaped groove; wherein the first motion arm comprises a first connection element and a first arc-shaped element connected to one end of the first connection element, an end of the first connection element of the first motion arm away from the first arc-shaped element is fixed in the first casing, the first arc-shaped element of the first motion arm is engaged in the first arc-shaped groove of the first fixed chute block, and the first arc-shaped element matches the first arc-shaped groove; and the second motion arm comprises a second connection element and a second arc-shaped element connected to one end of the second connection element, an end of the second connection element of the second motion arm away from the second arc-shaped element is fixed in the second casing, the second arc-shaped element of the second motion arm is engaged in the second arc-shaped groove of the second fixed chute block, and the second arc-shaped element matches the second arc-shaped groove.

In the foldable display device, the foldable display device further comprises a linkage mechanism and a third casing, wherein the third casing is disposed between the first casing and the second casing, the first fixed chute block and the second fixed chute block are fixed in the third casing, and the linkage mechanism comprises a first transmission assembly, a second transmission assembly, and a gear; wherein the first transmission assembly comprises a first rack and a first slider disposed on the first arc-shaped element, the first rack comprises a first side surface and a second side surface perpendicular to the first side surface, the first side face has a teeth-like flat strip arranged along a transmission direction, the second side surface is provided with a first chute, the first slider of the first arc-shaped element is engaged with the first chute, and the first rack is disposed on a first guiding surface provided on the first fixed chute block; and the second transmission assembly comprises a second rack and a second slider disposed on the second arc-shaped element, the second rack comprises a third side surface and a fourth side surface perpendicular to the third side surface, the third side face has a teeth-like flat strip arranged along a transmission direction, the fourth side surface is provided with a second chute, the second slider of the second arc-shaped element is engaged with the second chute, and the second rack is disposed on a second guiding surface provided on the second fixed chute block; and wherein the gear rotatably connected to the third casing, the teeth-like flat strip of the first rack arranged along the transmission direction is in mesh with the gear, and the teeth-like flat strip of the second rack arranged along the transmission direction is in mesh with the gear.

The present application has advantageous effects as follows: the present application provides a foldable display device comprising a first casing, a second casing, and a flexible display panel, wherein the first casing and the second casing are configured to support the flexible display panel, the first casing and the second casing are disposed opposite to each other, the first casing is rotatable about a first rotation center, and the second casing is rotatable about a second rotation center. Coordinates of an orthographic projection of the first rotation center on an xoy coordinate plane are (x1, y1), and coordinates of an orthographic projection of the second rotation center on the xoy coordinate plane are (−x1, y1). A predetermined value is defined by a sum of coordinate values x1 and y1, the coordinate value x1 is greater than zero, and the coordinate value y1 is greater than −0.3 millimeter (mm) and less than or equal to one mm. In this manner, during a bending process of the foldable display device, a normal stress at the interface between the OLED array layer and the thin-film encapsulation layer of the flexible display panel is less than 0.6281 MPa, and a shear stress in the thin-film encapsulation layer is less than 582.6 MPa, thereby preventing peeling between the OLED array layer and the thin-film encapsulation layer, and a fracture occurred in the thin-film encapsulation layer, and avoiding film peeling or breaking of the flexible display panel during bending of the foldable display device.

DESCRIPTION OF SPECIFIC EMBODIMENTS OF THE INVENTION

The technical solutions in the embodiments of the present application will be described clearly and completely in conjunction with the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

Figure 1:
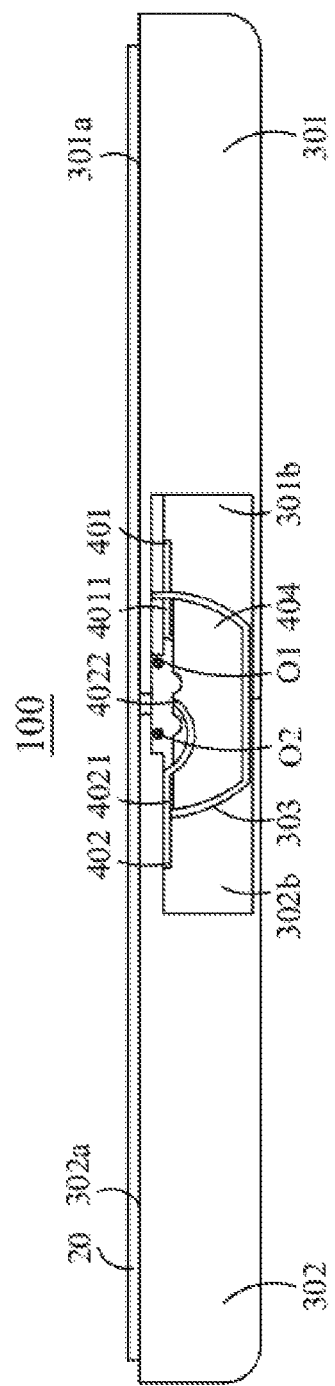
FIG. 1 is a schematic cross-sectional view of a foldable display device in a flat state in accordance with an embodiment of the present application.
Figure 2:
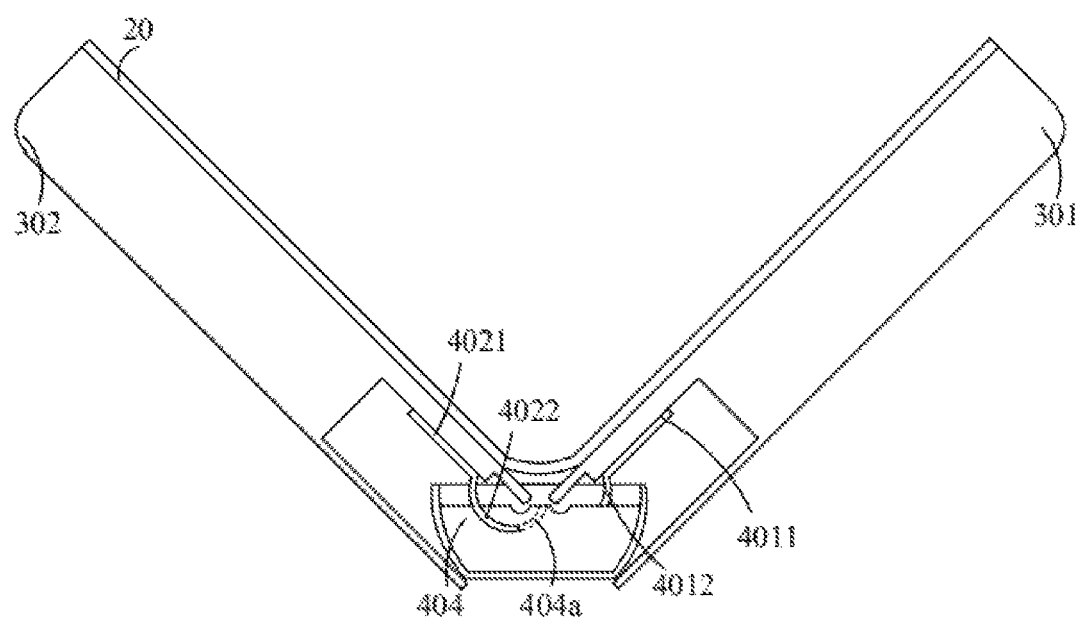
FIG. 2 is a schematic cross-sectional view of a foldable display device bending at 90 degrees in accordance with an embodiment of the present application.
Figure 3:
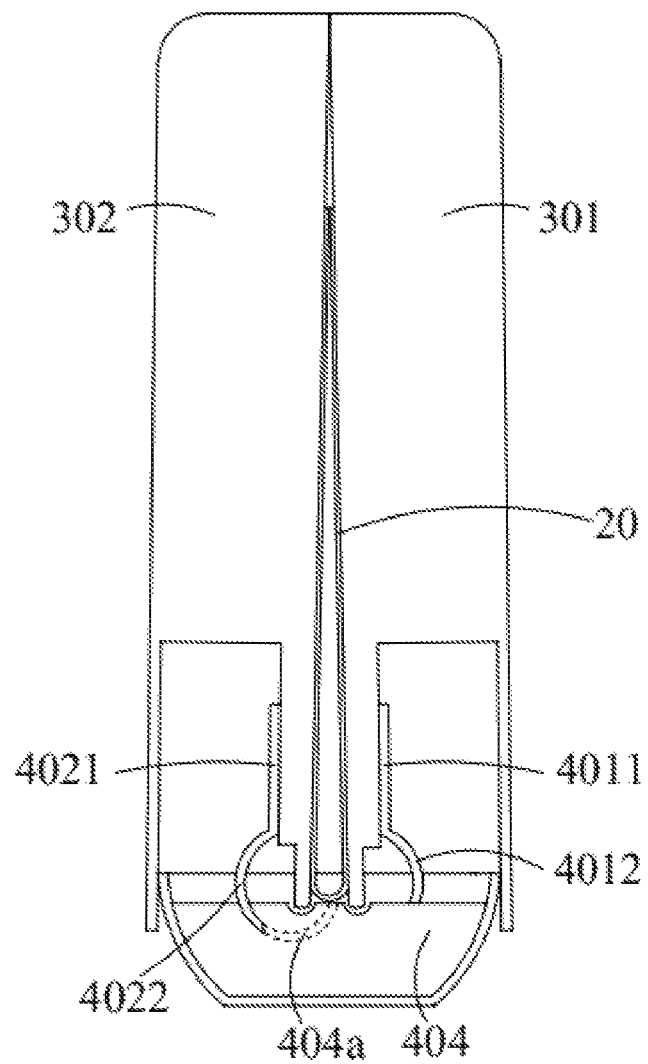
FIG. 3 is a schematic cross-sectional view of a foldable display device in a fully folded-up in accordance with an embodiment of the present application.
Figure 4:
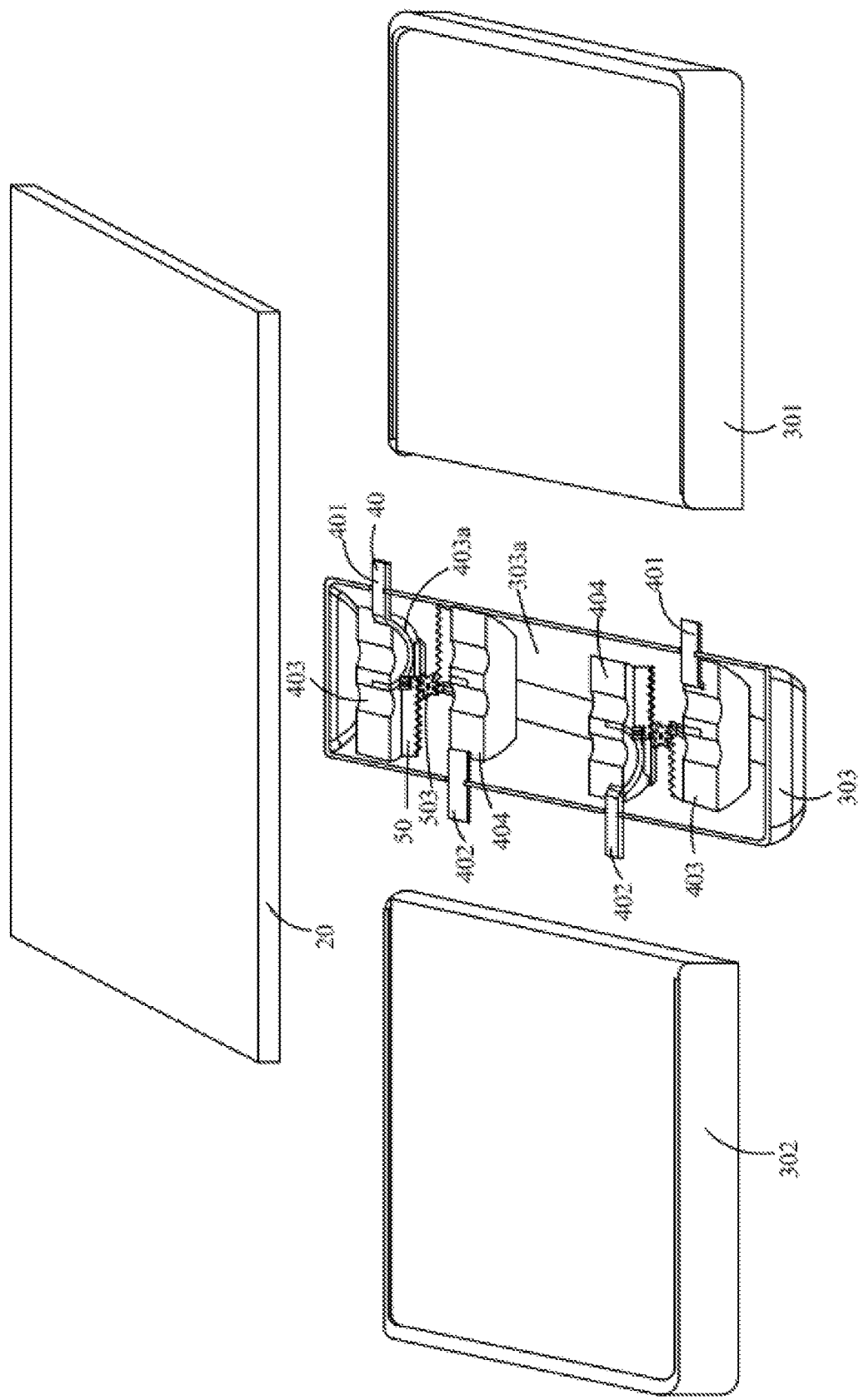
FIG. 4 is a schematic exploded view of a foldable display device in accordance with an embodiment of the present application.
Figure 5A:
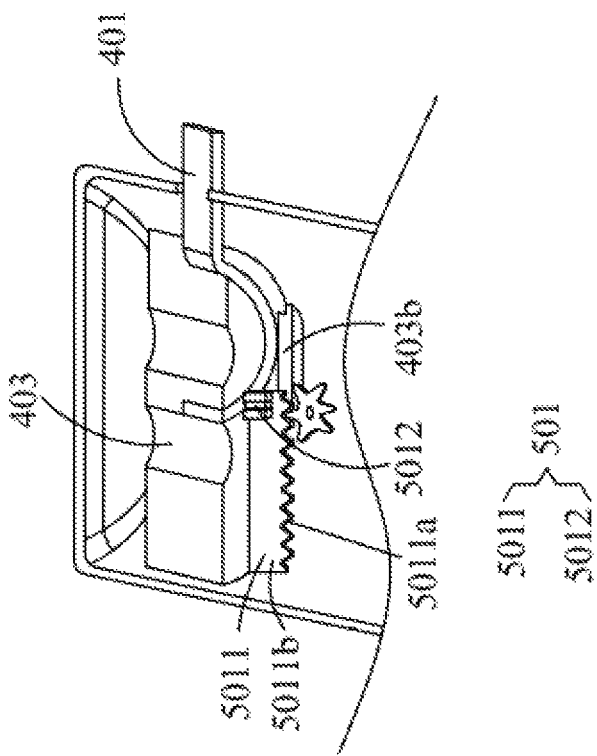
FIGS. 5A and 5B are schematic views showing a dual-axes rotation mechanism and a linkage mechanism shown in FIG. 4.
Figure 5B:
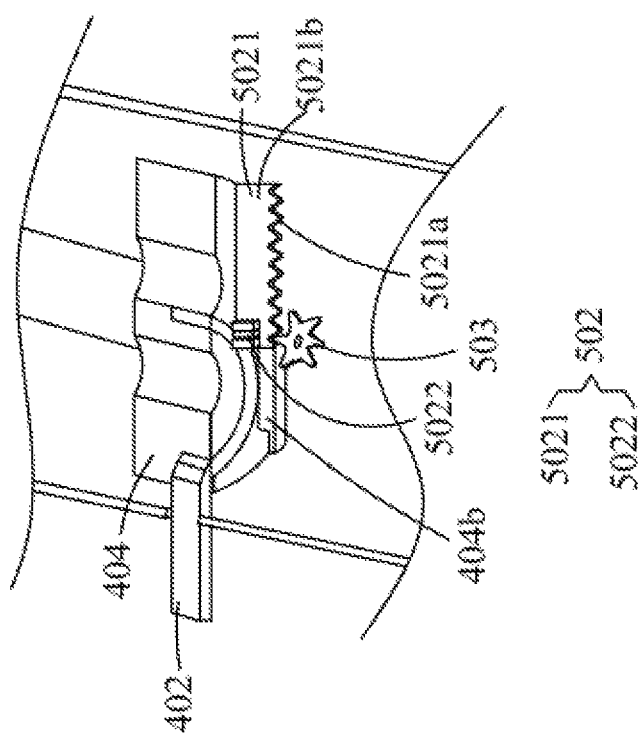
Figure 6A:
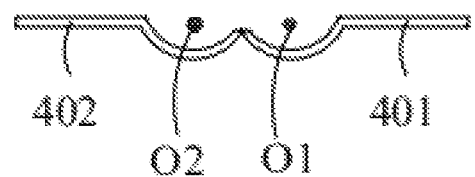
FIGS. 6A-6C are schematic views showing a rotation process of a first motion arm and a second motion arm of the dual-axes rotation mechanism of FIGS. 5A and 5B when the foldable display device is bending.
Figure 6B:
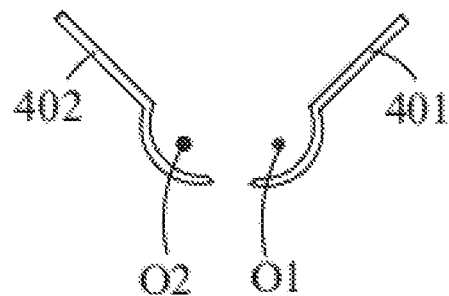
Figure 6C:
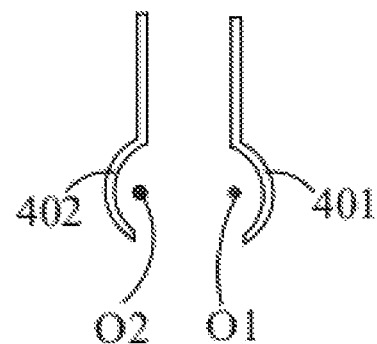

Please refer to FIGS. 1 to 6C. FIG. 1 is a schematic cross-sectional view of a foldable display device in a flat state in accordance with an embodiment of the present application. FIG. 2 is a schematic cross-sectional view of a foldable display device bending at 90 degrees in accordance with an embodiment of the present application. FIG. 3 is a schematic cross-sectional view of a foldable display device in a fully folded-up in accordance with an embodiment of the present application. FIG. 4 is a schematic exploded view of a foldable display device in accordance with an embodiment of the present application. FIGS. 5A and 5B are schematic views showing a dual-axes rotation mechanism and a linkage mechanism shown in FIG. 4. FIGS. 6A-6C are schematic views showing a rotation process of a first motion arm and a second motion arm of the dual-axes rotation mechanism of FIGS. 5A and 5B when the foldable display device is bending.

The display device 100 includes a first casing 301, a second casing 302, a third casing 303, a flexible display module 20, a dual-axes rotation mechanism 40, and a linkage mechanism 50.

The first casing 301 and the second casing 302 are configured to support the flexible display module 20. The first casing 301 has a first support surface 301*a*. The second casing 302 has a second support surface 302*a*. The second casing 302 and the first casing 301 are disposed opposite to each other. The first casing 301 is rotatable about a first rotation center O1, and the second casing 3025 is rotatable about a second rotation center O2. The first casing 301 and the second casing 302 rotate simultaneously and symmetrically. A first accommodation chamber 301*b* is formed at one end of the first casing 301 adjacent to the second casing 302. A second accommodation chamber 302*b* is formed at one end of the second casing 302 adjacent to the first casing 301.

The third casing 303 is provided to accommodate and fix the dual-axes rotation mechanism 40, and is also provided to accommodate the linkage mechanism 50. The third casing 303 is a casing having an accommodation hollow chamber 303*a*, and is disposed between the first casing 301 and the second casing 302.

The dual-axes rotation mechanism 40 includes a first motion arm 401 having the first rotation center O1, a second motion arm 402 having the second rotation center O2, a first fixed chute block 403 including a first arc-shaped groove 403*a*, and a second fixed chute block 404*a* including a second arc-shaped groove 404*a*. The first motion arm 401 and the second motion arm 402 rotate simultaneously and symmetrically.

The first motion arm 401 is connected to the first casing 301 so that the first casing 301 is rotatable about the first rotation center O1. The first motion arm 401 includes a first connection element 4011 and a first arc-shaped element 4012 connected to one end of the first connection element 4011. An end of the first connection element 4011 of the first motion arm 401 away from the first arc-shaped element 4012 is fixed in the first casing 301, the first arc-shaped element 4012 of the first motion arm 401 is engaged in the first arc-shaped groove 403*a* of the first fixed chute block 403, and the first arc-shaped element 4012 matches the first arc-shaped groove 403*a*. The first connection element 4011 of the first motion arm 401 is fixed to an inner wall enclosed to form the first accommodation chamber 301*b*.

The second motion arm 402 is connected to the second casing 302 so that the second casing 302 is rotatable about the second rotation center O2. The second motion arm 402 includes a second connection element 4021 and a second arc-shaped element 4022 connected to one end of the second connection element 4021. An end of the second connection element 4021 of the second motion arm 402 away from the second arc-shaped element 4022 is fixed in the second casing 302, the second arc-shaped element 4022 of the second motion arm 402 is engaged in the second arc-shaped groove 404a of the second fixed chute block 404, and the second arc-shaped element 4022 matches the second arc-shaped groove 404a. The second connection element 4021 of the second motion arm 402 is fixed to an inner wall enclosed to form the second accommodation chamber 302b. The first arc-shaped groove 403a of the first fixed chute block 403 is identical to the second arc-shaped groove 404a of the second fixed chute block 404.

The first fixed chute block 403 and the second fixed chute block 404 are both fixed in the third casing 303.

The linkage mechanism 50 is configured to enable simultaneous and symmetrical rotation of the first motion arm 401 and the second motion arm 402. The linkage mechanism 50 includes a first transmission assembly 501, a second transmission assembly 502, and a gear 503.

The first transmission assembly 501 includes a first rack 5011 and a first slider 5012 disposed on the first arc-shaped element 4012. The first rack 5011 includes a first side surface 5011a and a second side surface 5011b perpendicular to the first side surface 5011a. The first side face 5011a has a teeth-like flat strip arranged along a transmission direction, and the second side surface 5011b is provided with a first chute. The first slider 5012 of the first arc-shaped element 4012 is engaged with the first chute of the first rack 5011. The teeth-like flat strip of the first rack 5011 arranged along the transmission direction is in mesh with the gear 503. The first slider 5012 cooperates with the first chute of the first rack 5011. The first slider 5012 is cylindrical in shape. The first rack 5011 is disposed on a first guiding surface 403b provided on the first fixed chute block 403.

The second transmission assembly 502 includes a second rack 5021 and a second slider 5022 disposed on the second arc-shaped element 4022. The second rack 5021 includes a third side surface 5021a and a fourth side surface 5021b perpendicular to the third side surface 5021a. The third side face 5021a has a teeth-like flat strip arranged along a transmission direction, and the fourth side surface 5021b is provided with a second chute. The second slider 5022 of the second arc-shaped element 4022 is engaged with the second chute of the second rack 5021. The teeth-like flat strip of the second rack 5021 arranged along the transmission direction is in mesh with the gear 503. The second slider 5022 cooperates with the second chute of the second rack 5021. The second slider 5022 is cylindrical in shape. The gear 503 drives to connect the first rack 5011 and the second rack 5021. The second rack 5021 is disposed on a second guiding surface 404b provided on the second fixed chute block 404.

Please refer to FIG. 5 in combination with FIG. 4. When the first motion arm 401 rotates 45 degrees counterclockwise along the first arc-shaped groove 403a, the first slider 5012 adjoining the first motion arm 401 pushes the first rack 5011 to slide to the right in cooperation with the first chute on the first rack 5011, and that first rack 5011 drives the gear 503 to start to rotate. The rotation of the gear 503 drives the second rack 5021 to slide to the left with respect to the third casing 303, and the second rack 5021 sliding to the left drives the second motion arm 402 to move to the left in conjunction with the second rack 5021 through the second chute on the second rack 5021 in cooperation with the second slider 5022, so that the second motion arm 402 also rotates 45 degrees clockwise with respect to the third housing 303. That is, the first motion arm 401 drives the first casing 301 to rotate counterclockwise by 45 degrees, and the second motion arm 402 drives the second casing 302 to rotate clockwise by 45 degrees. The foldable display device as a whole is symmetrically constructed and operated, preventing the flexible display module from bending into an asymmetrical shape and causing greater stress when the foldable display device rotates on one side by an angle different from an angle of the other side. The first motion arm 401 continues to rotate about the first rotation center O1, and the second motion arm 402 rotates by the same angle in conjunction with the first motion arm 401. The first motion arm 401 and the second motion arm 402 are fixed on the first casing 301 and the second casing 302, respectively, then movement trajectories of the first motion arm 401 and the second motion arm 402 are completely reflected in the first casing 301 and the second casing 302. When the first casing 301 and the second casing 302 are linked to rotate until their ends are close to each other, a bending area is formed between the first casing 301 and the second casing 302 and makes a wedge-shaped space, so that the flexible display module is formed into a substantially smooth arc, which compensates for a difference in size between the mechanisms and the flexible display module.

Figure 7:
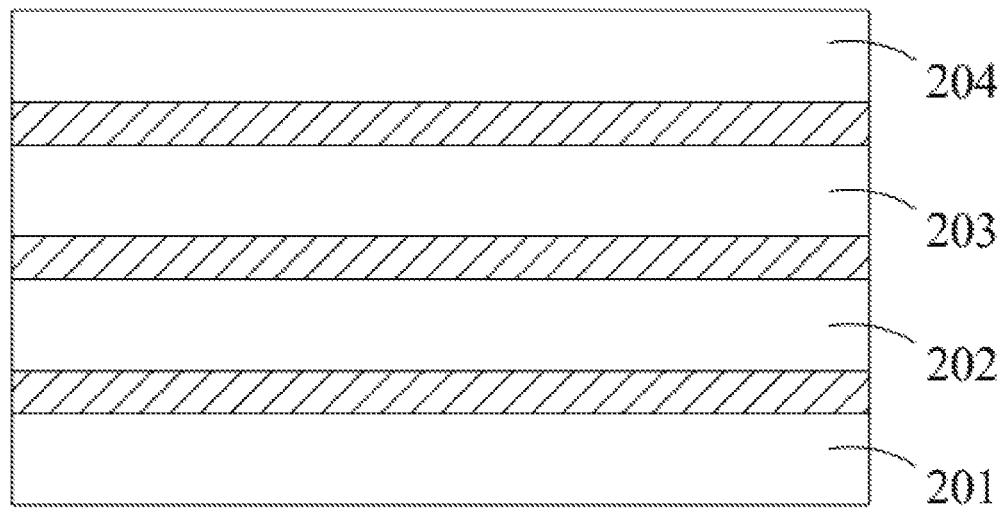
FIG. 7 is a schematic cross-sectional view of a flexible display module shown in FIG. 4.

As shown in FIG. 7, it is a schematic cross-sectional view of a flexible display module shown in FIG. 4. The flexible display module 20 includes a rear cover 201, a flexible display panel 202, a polarizer 203, and a protection cover 204. The rear cover 201, the flexible display panel 202, the polarizer 203, and the protection cover 204 are sequentially disposed. The rear cover 201 is configured to protect a rear side of a light-emitting surface of the flexible display panel 202. The rear cover 201 and the flexible display panel 202 are bonded together through a clear adhesive layer. The polarizer 203 is configured to increase contrast of the flexible display panel 200. The polarizer 203 and the flexible display panel 202 are bonded together through a clear adhesive layer. The protection cover 204 is provided to protect the polarizer 203 and the flexible display panel 202.

Figure 8:
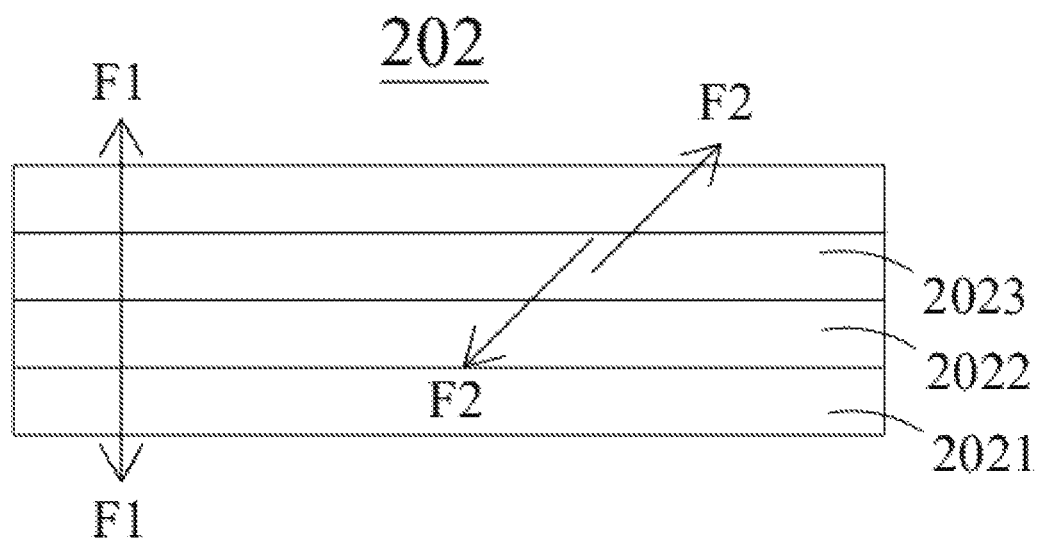
FIG. 8 is a schematic cross-sectional view of a flexible display panel shown in FIG. 7.

As shown in FIG. 8, FIG. 8 is a schematic cross-sectional view of a flexible display panel shown in FIG. 7. The flexible display panel 202 includes a flexible substrate 2021, an organic light-emitting diode (OLED) array layer 2022, and a thin-film encapsulation layer 2023. The thin-film encapsulation layer 2023 includes an organic insulating layer and an inorganic insulating layer. A material of preparing the inorganic insulating layer is selected from silicon nitride or silicon oxide. A material of preparing the organic insulating layer is selected from polyacrylate and the like. The flexible substrate 2021 is a polyimide layer. The OLED array layer 2022 includes a plurality of OLEDs arranged in an array.

During a bending process of a foldable display device, a flexible display panel may be failure for situations as follows: peeling occurred between the thin-film encapsulation layer 2023 and the OLED array layer 2022, and fractures of the thin-film encapsulation layer 2023. The peeling occurred between the thin-film encapsulation layer 2023 and the OLED array layer 2022 results from a normal stress F1 at an interface between the thin-film encapsulation layer 2023 and the OLED array layer 2022. The fractures of the thin-film encapsulation layer 2023 is due to an action of a shear stress F2 in the thin-film encapsulation layer 2023.

Figure 9:
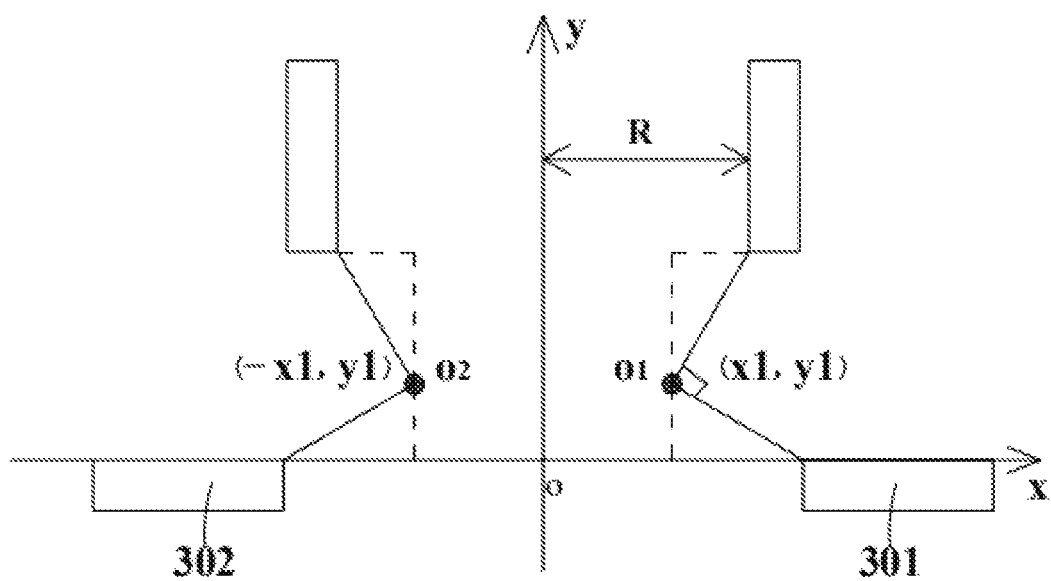
FIG. 9 is a schematic view showing orthographic projections of a first rotation center and a second rotation on an xoy coordinate plane.

As shown in FIG. 9, FIG. 9 is a schematic view showing orthographic projections of a first rotation center and a second rotation on an xoy coordinate plane. A y coordinate axis is defined by a straight line perpendicular to a plan on which the first casing 301 and the second casing 302 are located and extending to a middle between the first casing 301 and the second casing 302 when the foldable display device 100 is in a flat state. An x coordinate axis is defined by a straight line located on and overlapping a plane the same as that of surfaces of the first casing 301 and the second casing 302 adjacent to the flexible display panel 202 when the foldable display device 100 is in the flat state. The x coordinate axis and the y coordinate axis are coplanar and perpendicular to each other. The x coordinate axis is parallel to a line connecting two symmetrical points on the first casing 301 and the second casing 302. A coordinate origin o is defined by an intersection of the x coordinate axis and the y coordinate axis. The xoy coordinate plane is cooperatively defined by the x coordinate axis, the y coordinate axis, and the coordinate origin o. Coordinates of an orthographic projection of the first rotation center O1 on the xoy coordinate plane are (x1, y1), and coordinates of an orthographic projection of the second rotation center O2 on the xoy coordinate plane are (−x1, y1).

When the foldable display device is in the flat state, an angle between the first casing 301 and the second casing 302 is 180 degrees. After both the first casing 301 and the second casing 302 rotate 90 degrees, the angle between the first casing 301 and the second casing 302 is zero degree. When the angle between the first casing 301 and the second casing 302 is zero degree, a half of a distance between the first casing 301 and the second casing 302 is equal to a predetermined value R. Since the first casing 301 rotates about the first rotation center O1, it can be known from the geometric relationship that x1+y1=R, that is, a sum of x1 and y1 is equal to the predetermined value R.

In this embodiment, the predetermined value R is between 0.5 mm and 3 mm. When the predetermined value R is too small, a spacing between the first casing 301 and the second casing 302 will be too small after the foldable display device is fully folded, which is not beneficial for the flexible display module to be accommodated in the spacing between the first casing 301 and the second casing 302. When the predetermined value R is too large, a spacing between the first casing 301 and the second casing 302 is also too large, which is not good for an expected appearance of the entire foldable display device 100 after being folded. For example, the predetermined value R is 1 mm, 1.2 mm, 1.5 mm, 1.8 mm, 2.0 mm, 2.5 mm, or 3.0 mm.

In this embodiment, the coordinate value x1 is greater than zero and the coordinate value y1 is greater than −0.3 mm and less than or equal to 1 mm, thereby to prevent the flexible display panel 202 from peeling or having a fracture, and especially to avoid peeling between the OLED array layer 2022 and the thin-film encapsulation layer 2023, and a fracture occurred in the thin-film encapsulation layer 2023. When the coordinate value y1 is less than or equal to one mm, a normal stress between the OLED array layer 2022 and the thin-film encapsulation layer 2023 is less than 0.6 megapascals (Mpa), and a shear stress in the thin-film encapsulation layer 2023 is less than 500 Mpa, thereby preventing peeling between the OLED array layer 2022 and the thin-film encapsulation layer 2023, and a fracture occurred in the thin-film encapsulation layer 2023.

Preferably, the coordinate value y1 is greater than or equal to −0.1 mm to further reduce a normal stress at an interface between the OLED array layer 2022 and the thin-film encapsulation layer 2023 and a shear stress in the thin-film encapsulation layer 2023. Alternatively, the coordinate value y1 is less than or equal to 0.5 mm to further reduce a normal stress at an interface between the OLED array layer 2022 and the thin-film encapsulation layer 2023.

In this embodiment, the coordinate value y1 is greater than or equal to −0.1 mm and less than or equal to 0.3 mm, so that a normal stress at an interface between the OLED array layer and the thin-film encapsulation layer is less than 0.1 Mpa when the foldable display device is bending, thereby preventing the OLED array layer 2022 and the thin-film encapsulation layer 2023 from peeling, and enabling a shear stress in the thin-film encapsulation layer 2023 less than 245 Mpa, so that a fracture of the thin-film encapsulation layer 2023 can be avoided.

In this embodiment, the flexible display panel includes the OLED array layer 2022. The OLED array layer 2022 is spaced apart from the surfaces of the first casing 301 and the second casing 302 adjacent to the flexible display panel 202 at a distance greater than or equal to 0.1 mm and less than or equal to 0.3 mm when the foldable display device is in the flat state. For example, the distance may be 0.12 mm, 0.15 mm, 0.18 mm, 0.2 mm, 0.25 mm, or 0.28 mm.

In this embodiment, the first rotation center O1 and the second rotation center O2 are located at a side of a lower surface of the OLED array layer 2022 adjacent to the first casing 301 and the second casing 302 in a direction of the y coordinate axis when the foldable display device is in the flat state, and each of the first rotation center O1 and the second rotation center O2 is spaced at a distance greater than or equal to 0 mm and less than or equal to 0.243 mm from the lower surface of the OLED array layer 2022.

Alternatively, the first rotation center O1 and the second rotation center O2 are located at a side of the lower surface of the OLED array layer 2022 away from the first casing 301 and the second casing 302, wherein each of the first rotation center O1 and the second rotation center O2 is spaced at a distance greater than 0 mm and less than or equal to 0.157 mm from the lower surface of the OLED array layer 2022, wherein the lower surface of the OLED array layer 2022 is a surface of the OLED array layer 2022 adjacent to the first casing 301 and second casing 302.

In this embodiment, the first casing 301 is rotatable about the first rotation center O1 with a radius between 1 mm and 10 mm, and the second casing 302 is rotatable about the second rotation center O2 with a radius between 1 mm and 10 mm. That is, each of the first motion arm 401 and the second motion arm 402 has a radius between 1 mm and 10 mm. The radius of the first moving arm 401 and the second moving arm 402 is less than 1 mm will increase difficulty of manufacturing the foldable display device. When the radius of each of the first moving arm 401 and the second moving arm 402 is greater than 10 mm, it is not beneficial for a compact configuration of the foldable display device. Preferably, the radius may be 2 mm, 3 mm, 4 mm, 5.5 mm, or 8 mm.

Figure 10:
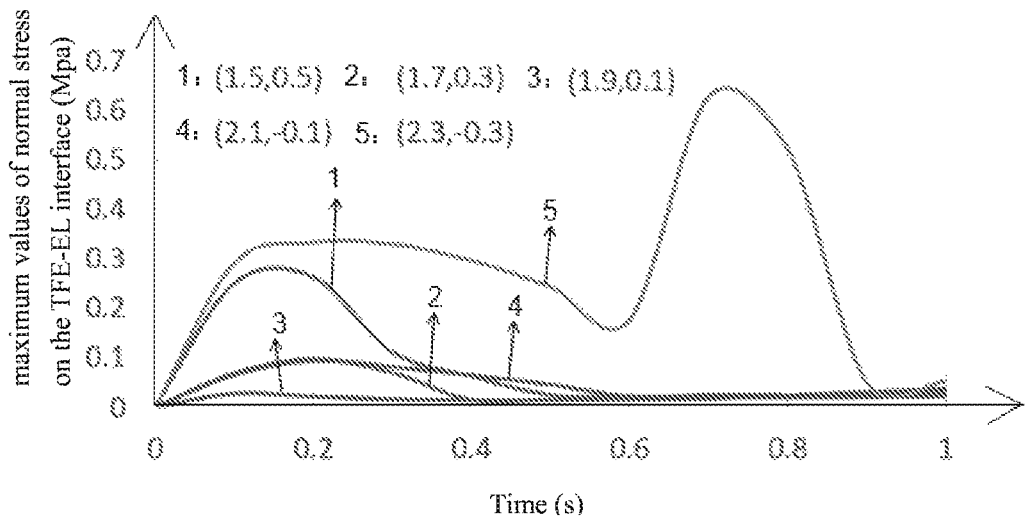
FIG. 10 is a schematic view showing a change of normal stress between an organic light-emitting diode array layer and a thin-film encapsulation layer with time during a bending process of the flexible display device when a predetermined value R is two millimeters (mm) and coordinates x1 and y1 are different values.
Figure 11:
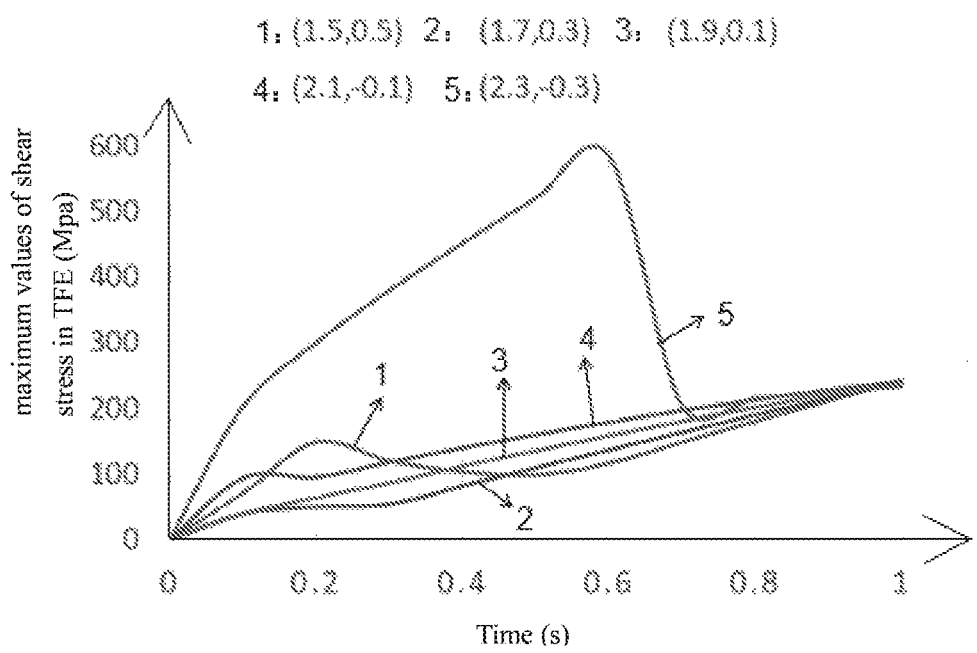
FIG. 11 is a schematic view showing a change of shear stress in the thin-film encapsulation layer with time when a predetermined value R is two mm and coordinates x1 and y1 are different values.

Please refer to FIGS. 10 and 11. FIG. 10 is a schematic view showing a change of normal stress between the OLED array layer and the thin-film encapsulation layer with time during a bending process of the flexible display device when a predetermined value R is 2 mm and coordinates x1 and y1 are different values. FIG. 11 is a schematic view showing a change of shear stress in the thin-film encapsulation layer with time when a predetermined value R is two mm and coordinates x1 and y1 are different values. Specifically, a folding time of the foldable display device 100 from flat to fully folded (wedge-shaped folding) is one second. The OLED array layer 2022 is spaced apart from the surfaces of the first casing 301 and the second casing 302 adjacent to the flexible display panel 202 at a distance of 0.143 mm when the foldable display device 100 is in the flat state. The thin-film encapsulation layer 2023 has thickness of 0.01 mm.

As can be seen in FIG. 10, when the foldable display device is bent from the flat state to the fully folded-up state, a normal stress at the interface between the OLED array layer 2022 and the thin-film encapsulation layer 2023 is constantly changing. During the bending process of the foldable display device 100, when the predetermined value R is 2 mm, a maximum normal stress at the interface between the OLED array layer 2022 and the thin-film encapsulation layer 2023 corresponding to different coordinates (x1, y1) is shown in Table 1 below.

Table 1 illustrates various maximum values of a normal stress at the interface between the OLED array layer and the thin-film encapsulation layer corresponding to different coordinates (x1, y1) when the predetermined value R is 2 mm.

| | (x1, y1) | | | | |
|---|---|---|---|---|---|
| | (1.5 mm, 0.5mm) | (1.7 mm, 0.3 mm) | (1.9 mm, 0.1 mm) | (2.1 mm, −0.1 mm) | (2.3 mm, −0.3 mm) |
| maximum normal stress (MPa) | 0.2648 | 0.09737 | 0.03389 | 0.09476 | 0.6281 |

As can be seen from Table 1, when a sum of coordinates x1 and y1 is 2 mm, y1 less than −0.3 mm will cause a maximum value of the normal stress at the interface between the OLED array layer 2022 and the thin-film encapsulation layer 2023 to be greater than 0.6281 MPa, giving rise to a risk of peeling between the OLED array layer 2022 and the thin-film encapsulation layer 2023. When y1 is 0.5 mm, a maximum value of a normal stress at the interface between the OLED array layer 2022 and the thin-film encapsulation layer 2023 is 0.2648 MPa, and when y1 is greater than or equal to −0.1 mm and less than or equal to 0.3 mm, a maximum value of a normal stress at the interface between the OLED array layer 2022 and the thin-film encapsulation layer 2023 is less than 0.1 MPa, so that peeling between the OLED array layer 2022 and the thin-film encapsulation layer 2023 can be completely prevented. The change of y1 value has a greater influence on the maximum value of the normal stress at the interface between the OLED array layer 2022 and the thin-film encapsulation layer 2023.

As can be seen from FIG. 11, when the foldable display device is bent from the flat state to the fully folded-up state, shear stress in the thin-film encapsulation layer 2023 is constantly changing. During a process of bending the foldable display device, when the predetermined value R is 2 mm, a maximum shear stress in the thin-film encapsulation layer corresponding to different coordinates (x1, y1) is shown in Table 2 below.

Table 2 illustrates various maximum values of a shear stress in the thin-film encapsulation layer corresponding to different coordinates (x1, y1) when the predetermined value R is 2 mm.

| | (x1, y1) | | | | |
|---|---|---|---|---|---|
| | (1.5 mm, 0.5 mm) | (1.7 mm, 0.3 mm) | (1.9 mm, 0.1 mm) | (2.1 mm, −0.1 mm) | (2.3 mm, −0.3 mm) |
| maximum shear stress (MPa) | 242.1 | 240.9 | 240.1 | 239.5 | 582.6 |

As can be seen from Table 2, when a sum of coordinates x1 and y1 is 2 mm, y1 less than −0.3 mm will cause a maximum value of the shear stress in the thin-film encapsulation layer 2023 to be greater than 582.6 MPa, giving rise to a risk of a fracture occurred in the thin-film encapsulation layer. When y1 is reduced from 0.5 mm to −0.1 mm, the shear stress inside the thin-film encapsulation layer 2023 is changed around 240 MPa, without a significant difference.

As shown in FIGS. 10 and 11, when the predetermined value R is 2 mm, y1 varies from −0.1 mm to 0.3 mm, the maximum value of the normal stress at the interface between the OLED array layer 2022 and the thin-film encapsulation layer 2023 and the maximum value of the shear stress in the thin-film encapsulation layer 2023 are both low, so that during the process of bending the foldable display device, the risk of peeling between the OLED array layer 2022 and the thin-film encapsulation layer 2023 and the risk of causing a fracture in the thin-film encapsulation layer 2023 are relatively low.

Figure 12:
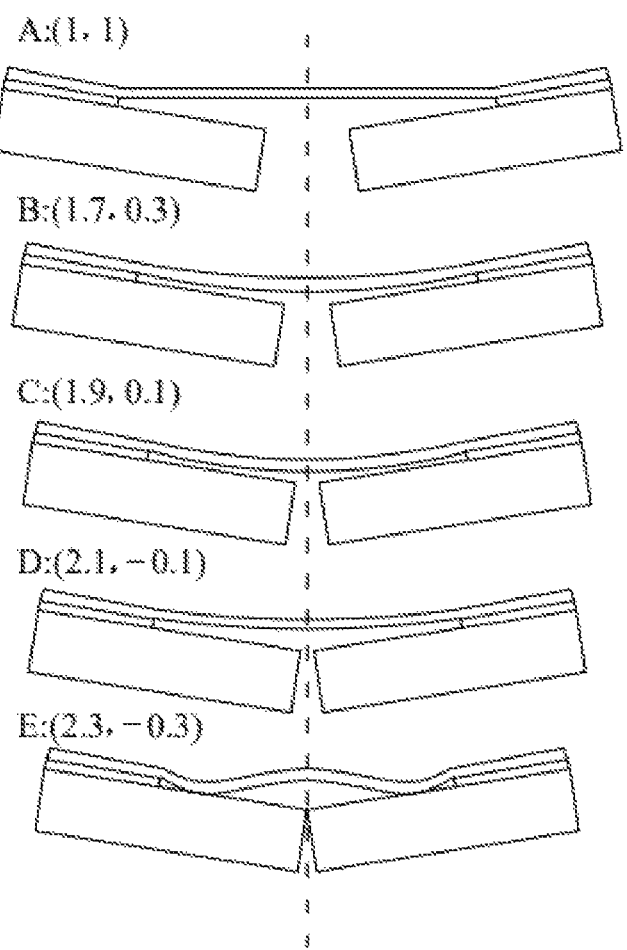
FIG. 12 is a schematic view showing a flexible display module in different shapes when a predetermined value R is two mm and coordinates x1 and y1 are different values.

Please refer to FIG. 12. FIG. 12 is a schematic view showing a flexible display module in different shapes when a predetermined value R is 2 mm and coordinates (x1, y1) are different values. In FIG. 12, shape A is a schematic view showing the flexible display module is bent when x1 is 1 mm and y1 is 1 mm, shape B is a schematic view showing the flexible display module is bent when x1 is 1.7 mm and y1 is 0.3 mm, shape C is a schematic view showing the flexible display module is bent when x1 is 1.9 mm and y1 is 0.1 mm, shape D is a schematic view showing the flexible display module is bent when x1 is 2.0 mm and y1 is −0.1 mm, and shape E is a schematic view showing the flexible display module is bent when x1 is 2.3 mm and y1 is −0.3 mm. The above shapes are illustrated to be compared with each other in a same process of bending. Specifically, when the flexible display module is in the beginning of rotation, a value of y1 is large; for ample, when x1 is 1 mm and y1 is 1 mm, a spacing between the first casing 301 and the second casing 302 is large, and thus the flexible display module 20 is susceptible to be pulled. When y1 is small, for example, x1 is 2.3 mm and y1 is −0.3 mm, a spacing between first casing 301 and the second casing 302 is small in the beginning of rotation, and thus the display module is susceptible to be squeezed. The smaller or larger value of y1 will cause stress in the bending process of the flexible display module 20 to increase.

During a bending process of the foldable display device 100, the flexible display panel 202 serves as the most critical functional layer, and the control of stress applied to the flexible display panel during the bending process is a key point. The stress to be controlled particularly means the control of a normal stress at an interface between the OLED array layer 2022 and the thin-film encapsulation layer 2023 and a shear stress in the thin-film encapsulation layer 2023. The OLED array layer 2022 is spaced apart from the first casing 301 and the second casing 302 at a distance between 0.1 mm and 0.35 mm when the foldable display device 100 is in a flat state. A profile of the flexible display module 20 in a fold-up process can be varied by controlling a distance from the first rotation center O1 and the second rotation center O2 to the surfaces of the first casing 301 and the second casing 302 adjacent to the flexible display panel 202 when the foldable display device 100 is in the flat state, so that stress imposed on the flexible display panel 202 during bending can be reduced, and a risk of failure of the flexible display panel 202 can be avoided.

Since film layers below the OLED array layer 2022 in the flexible display module 20 are complex, the predetermined value R is limited to 0.5 mm-3 mm. In addition, when the OLED array layer 2022 is spaced apart from the surfaces of the first casing 301 and the second casing 302 adjacent to the flexible display panel 202 at a distance of 0.143 mm when the foldable display device 100 is in the flat state, ordinate y1 of an orthographic projection of each of the first rotation center O1 and the second rotation center O2 preferably varies from −0.1 mm to 0.3 mm, each of the first rotation center O1 and the second rotation center O2 is preferably spaced at a distance between 0 mm and 0.243 mm from the lower surface of the OLED array layer 2022 (a surface of the OLED array layer 2022 adjacent to the first casing and the second casing), or each of the first rotation center O1 and the second rotation center O2 is spaced at a distance between 0 mm and 0.157 mm from the lower surface of the OLED array layer 2022.

Accordingly, although the present invention has been disclosed as a preferred embodiment, it is not intended to limit the present invention. Those skilled in the art without departing from the scope of the present invention may make various changes or modifications, and thus the scope of the present invention should be after the appended claims and their equivalents.

What is claimed is:

1. A foldable display device, comprising:
   a first casing, a second casing, and a flexible display panel, wherein the first casing and the second casing are configured to support the flexible display panel, the first casing and the second casing are disposed opposite to each other, the first casing is rotatable about a first rotation center, and the second casing is rotatable about a second rotation center;
   wherein a y coordinate axis is defined by a straight line perpendicular to a plan on which the first casing and the second casing are located and extending to a middle between the first casing and the second casing when the foldable display device is in a flat state; and
   an x coordinate axis is defined by a straight line located on and overlapping a plane the same as that of surfaces of the first casing and the second casing adjacent to the flexible display panel when the foldable display device is in the flat state;
   wherein the x coordinate axis and the y coordinate axis are coplanar and perpendicular to each other, a coordinate origin o is defined by an intersection of the x coordinate axis and the y coordinate axis, and an xoy coordinate plane is cooperatively defined by the x coordinate axis, the y coordinate axis, and the coordinate origin, wherein coordinates of an orthographic projection of the first rotation center on the xoy coordinate plane are (x1, y1), and coordinates of an orthographic projection of the second rotation center on the xoy coordinate plane are (−x1, y1);
   wherein a predetermined value is defined by a sum of coordinate values x1 and y1, the coordinate value x1 is greater than zero, the coordinate value y1 is greater than −0.3 millimeter (mm) and less than or equal to 1 mm, and the predetermined value is greater than zero mm and less than or equal to 2.5 mm;
   wherein the flexible display panel comprises an organic light-emitting diode (OLED) array layer, and the OLED array layer is spaced apart from the surfaces of the first casing and the second casing adjacent to the flexible display panel;
   wherein the first rotation center and the second rotation center are located at a side of a lower surface of the OLED array layer adjacent to the first casing and the second casing in a direction of the y coordinate axis when the foldable display device is in the flat state, and each of the first rotation center and the second rotation center is spaced at a distance greater than or equal to 0 mm and less than or equal to 0.243 mm from the lower surface of the OLED array layer, or the first rotation center and the second rotation center are located at a side of the lower surface of the OLED array layer away from the first casing and the second casing, wherein each of the first rotation center and the second rotation center is spaced at a distance greater than 0 mm and less than or equal to 0.157 mm from the lower surface of the OLED array layer, wherein the lower surface of the OLED array layer is a surface of the OLED array layer adjacent to the first casing and second casing.

2. The foldable display device of claim 1, wherein the coordinate value y1 is greater than or equal to −0.1 mm.

3. The foldable display device of claim 1, wherein the coordinate value y1 is less than or equal to 0.5 mm.

4. The foldable display device of claim 1, wherein the coordinate value y1 is greater than or equal to −0.1 mm and less than or equal to 0.3 mm.

5. The foldable display device of claim 1, wherein the coordinate value x1 is 1.9 mm and the coordinate value y1 is 0.1 mm.

6. The foldable display device of claim 1, wherein the OLED array layer is spaced apart from the surfaces of the first casing and the second casing adjacent to the flexible display panel at a distance greater than or equal to 0.1 mm and less than or equal to 0.3 mm when the foldable display device is in the flat state.

7. The foldable display device of claim 1, wherein the first casing is rotatable about the first rotation center with a radius between 1 mm and 10 mm, and the second casing is rotatable about the second rotation center with a radius between 1 mm and 10 mm.

8. The foldable display device of claim 1, wherein the first casing and the second casing are configured to rotate simultaneously and symmetrically, and the foldable display device further comprises a dual-axes rotation mechanism;
   wherein the dual-axes rotation mechanism comprises a first motion arm having the first rotation center, a second motion arm having the second rotation center, a first fixed chute block comprising a first arc-shaped groove, and a second fixed chute block comprising a second arc-shaped groove;
   wherein the first motion arm comprises a first connection element and a first arc-shaped element connected to one end of the first connection element, an end of the first connection element of the first motion arm away from the first arc-shaped element is fixed in the first casing, the first arc-shaped element of the first motion arm is engaged in the first arc-shaped groove of the first fixed chute block, and the first arc-shaped element matches the first arc-shaped groove; and
   the second motion arm comprises a second connection element and a second arc-shaped element connected to one end of the second connection element, an end of the second connection element of the second motion arm away from the second arc-shaped element is fixed in the second casing, the second arc-shaped element of the second motion arm is engaged in the second arc-shaped groove of the second fixed chute block, and the second arc-shaped element matches the second arc-shaped groove.

9. A foldable display device, comprising:

a first casing, a second casing, and a flexible display panel, wherein the first casing and the second casing are configured to support the flexible display panel, the first casing and the second casing are disposed opposite to each other, the first casing is rotatable about a first rotation center, and the second casing is rotatable about a second rotation center;

wherein a y coordinate axis is defined by a straight line perpendicular to a plan on which the first casing and the second casing are located and extending to a middle between the first casing and the second casing when the foldable display device is in a flat state; and an x coordinate axis is defined by a straight line located on and overlapping a plane the same as that of surfaces of the first casing and the second casing adjacent to the flexible display panel when the foldable display device is in the flat state;

wherein the x coordinate axis and the y coordinate axis are coplanar and perpendicular to each other, a coordinate origin o is defined by an intersection of the x coordinate axis and the y coordinate axis, and an xoy coordinate plane is cooperatively defined by the x coordinate axis, the y coordinate axis, and the coordinate origin, wherein coordinates of an orthographic projection of the first rotation center on the xoy coordinate plane are (x1, y1), and coordinates of an orthographic projection of the second rotation center on the xoy coordinate plane are (−x1, y1);

wherein a predetermined value is defined by a sum of coordinate values x1 and y1, the coordinate value x1 is greater than zero, the coordinate value y1 is greater than −0.3 millimeter (mm) or equal to 1 mm, and the predetermined value is greater than zero;

wherein the flexible display panel comprises an organic light-emitting diode (OLED) array layer, and the OLED array layer is spaced apart from the surfaces of the first casing and the second casing;

wherein the first rotation center and the second rotation center are located at a side of a lower surface of the OLED array layer adjacent to the first casing and the second casing in a direction of the y coordinate axis when the foldable display device is in the flat state, and each of the first rotation center and the second rotation center is spaced at a distance greater than or equal to 0 mm and less than or equal to 0.243 mm from the lower surface of the OLED array layer, or the first rotation center and the second rotation center are located at a side of the lower surface of the OLED array layer away from the first casing and the second casing, wherein each of the first rotation center and the second rotation center is spaced at a distance greater than 0 mm and less than or equal to 0.157 mm from the lower surface of the OLED array layer, wherein the lower surface of the OLED array layer is a surface of the OLED array layer adjacent to the first casing and second casing.

10. The foldable display device of claim 9, wherein the coordinate value y1 is greater than or equal to −0.1 mm.

11. The foldable display device of claim 9, wherein the coordinate value y1 is less than or equal to 0.5 mm.

12. The foldable display device of claim 9, wherein the coordinate value y1 is greater than or equal to −0.1 mm and less than or equal to 0.3 mm.

13. The foldable display device of claim 9, wherein the predetermined value is between 0.5 mm and −3 mm.

14. The foldable display device of claim 9, wherein the coordinate value x1 is 1.9 mm and the coordinate value y1 is 0.1 mm.

15. The foldable display device of claim 9, wherein the OLED array layer is spaced apart from the surfaces of the first casing and the second casing adjacent to the flexible display panel at a distance greater than or equal to 0.1 mm and less than or equal to 0.3 mm when the foldable display device is in the flat state.

16. The foldable display device of claim 9, wherein the first casing is rotatable about the first rotation center with a radius between 1 mm and 10 mm, and the second casing is rotatable about the second rotation center with a radius between 1 mm and 10 mm.

17. The foldable display device of claim 9, wherein the first casing and the second casing are configured to rotate simultaneously and symmetrically, and the foldable display device further comprises a dual-axes rotation mechanism;

wherein the dual-axes rotation mechanism comprises a first motion arm having the first rotation center, a second motion arm having the second rotation center, a first fixed chute block comprising a first arc-shaped groove, and a second fixed chute block comprising a second arc-shaped groove;

wherein the first motion arm comprises a first connection element and a first arc-shaped element connected to one end of the first connection element, an end of the first connection element of the first motion arm away from the first arc-shaped element is fixed in the first casing, the first arc-shaped element of the first motion arm is engaged in the first arc-shaped groove of the first fixed chute block, and the first arc-shaped element matches the first arc-shaped groove; and the second motion arm comprises a second connection element and a second arc-shaped element connected to one end of the second connection element, an end of the second connection element of the second motion arm away from the second arc-shaped element is fixed in the second casing, the second arc-shaped element of the second motion arm is engaged in the second arc-shaped groove of the second fixed chute block, and the second arc-shaped element matches the second arc-shaped groove.

18. The foldable display device of claim 17, further comprising a linkage mechanism and a third casing, wherein the third casing is disposed between the first casing and the second casing, the first fixed chute block and the second fixed chute block are fixed in the third casing, and the linkage mechanism comprises a first transmission assembly, a second transmission assembly, and a gear;

wherein the first transmission assembly comprises a first rack and a first slider disposed on the first arc-shaped element, the first rack comprises a first side surface and a second side surface perpendicular to the first side surface, the first side face has a teeth-like flat strip arranged along a transmission direction, the second side surface is provided with a first chute, the first slider of the first arc-shaped element is engaged with the first chute, and the first rack is disposed on a first guiding surface provided on the first fixed chute block; and the second transmission assembly comprises a second rack and a second slider disposed on the second arc-shaped element, the second rack comprises a third side surface and a fourth side surface perpendicular to the third side surface, the third side face has a teeth-like flat strip arranged along a transmission direction, the fourth side surface is provided with a second chute, the second slider of the second arc-shaped element is engaged with the second chute, and the second rack is disposed on a second guiding surface provided on the second fixed chute block; and wherein the gear rotatably connected to the third casing, the teeth-like flat strip of the first rack arranged along the transmission direction is in mesh with the gear, and the teeth-like flat strip of the second rack arranged along the transmission direction is in mesh with the gear.

\* \* \* \* \*